United States Patent [19]
Wang

[11] Patent Number: 6,087,857
[45] Date of Patent: Jul. 11, 2000

[54] CLOCK SIGNAL PHASE COMPARATOR

[75] Inventor: Sung-Ho Wang, Seoul, Rep. of Korea

[73] Assignee: LG Semicon Co., Ltd.

[21] Appl. No.: 08/943,184

[22] Filed: Oct. 3, 1997

[30]     Foreign Application Priority Data

Apr. 26, 1997 [KR]   Rep. of Korea ...................... 97-15777

[51] Int. Cl.[7] ................................................. G01R 25/00
[52] U.S. Cl. .................................... 327/5; 327/7; 327/12; 327/158
[58] Field of Search ................................. 327/12, 2, 3, 5, 327/7, 155, 156, 158, 159, 0.8

[56]          References Cited

U.S. PATENT DOCUMENTS

| | | | |
|---|---|---|---|
| 3,600,690 | 8/1971 | White | 328/133 |
| 4,380,083 | 4/1983 | Anderson et al. | 375/120 |
| 5,223,755 | 6/1993 | Richley | 327/158 |
| 5,440,274 | 8/1995 | Bayer | 331/1 A |
| 5,455,540 | 10/1995 | Williams | 331/1 A |
| 5,570,054 | 10/1996 | Takla | 327/292 |
| 5,619,148 | 4/1997 | Guo | 327/3 |
| 5,663,665 | 9/1997 | Wang et al. | 327/3 |
| 5,789,947 | 8/1998 | Sato | 327/3 |

*Primary Examiner*—Kenneth B. Wells
*Assistant Examiner*—Hai L. Nguyen

[57]            ABSTRACT

A clock signal phase comparator includes a first delay unit for delaying a clock signal for a predetermined time, a first phase detector for comparing an output signal of the first delay unit and a reference clock signal and outputting a first high or low level output signal, a second delay unit for delaying for a predetermined time and outputting the reference clock signal, and a second phase detector for comparing an output signal of the second delay unit and the clock signal and outputting a second high or low level output signal. The phase comparator separately displays the phase comparison results in grades of fast, slow and locking, and when a locked phase is detected, the phase control system is partially or entirely disabled, for thereby reducing current consumption of the system.

3 Claims, 3 Drawing Sheets

FIG.1
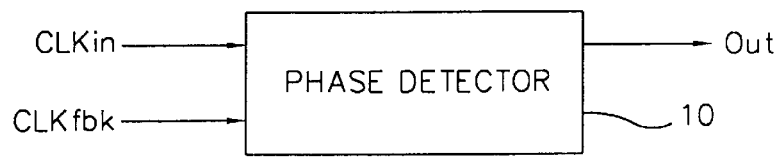
FIG.2
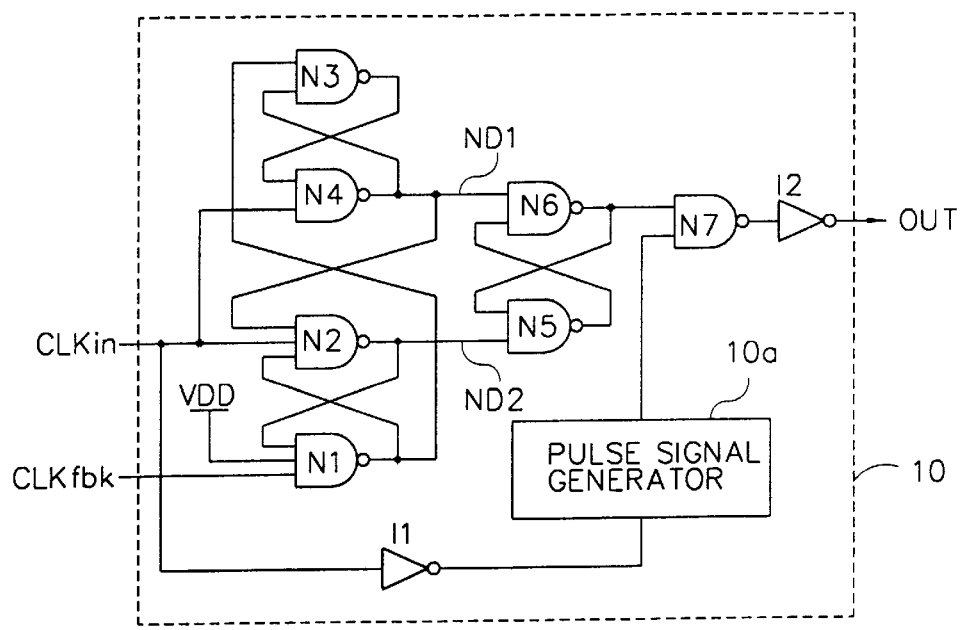
FIG.3A CLKfbk 
FIG.3B CLKin 
FIG.3C OUT 

FIG.6
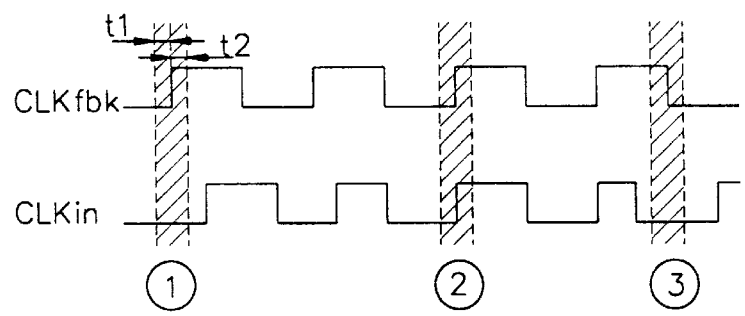
FIG.7
| OUT1 | OUT2 | RESULT |
|------|------|-----------|
| 1    | 1    | FAST      |
| 0    | 0    | SLOW      |
| 0    | 1    | LOCKING   |
| 1    | 0    | UNCHANGED |
FIG.8
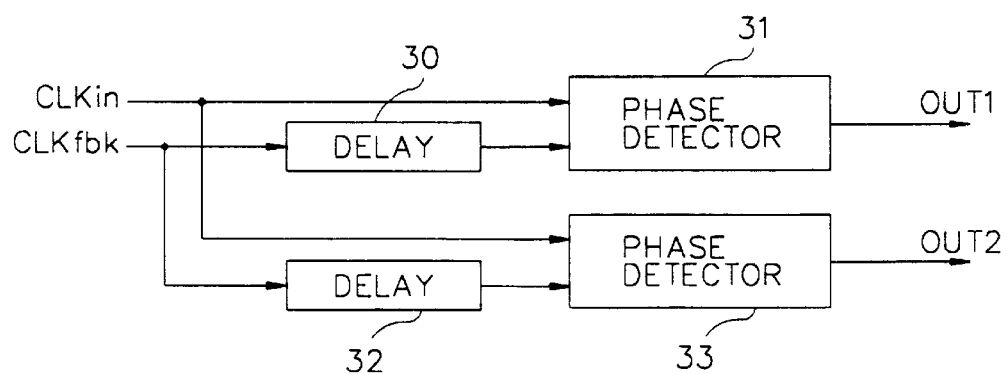

CLOCK SIGNAL PHASE COMPARATOR

BACKGROUND OF THE INVENTION

1. Field of the Invention

The present invention relates to a clock signal phase comparator, and more particularly to an improved clock signal phase comparator employed in a phase control system and capable of decreasing current consumption in the phase control system by partially or entirely disabling the phase control system when a phase-locked clock signal is detected.

2. Description of the Prior Art

As shown in FIG. 1, a clock signal phase comparator according to the conventional art includes a phase detector 10 which compare a clock signal CLKin to a reference clock signal CLKfbk that results from feedback via a voltage controlled oscillator (not shown), and which outputs a high or low level output signal OUT to a phase control system (not shown).

With reference to FIG. 2, the phase detector 10 includes: a NAND gate N1 for NANDing the base clock signal CLKfbk and a supply voltage signal VDD; a NAND gate N2 for NANDing an output signal of the NAND gate N1 and the clock signal CLKin and for outputting the resultant signal to a node ND2; a NAND gate N3 for NANDing the output signal from the NAND gate N1 and another input signal; a NAND gate N4 for NANDing the output signal of the NAND gate N3 and the clock signal CLKin, and for outputting the resultant signal to a node ND1; a NAND gate N5 for NANDing the output signals from NAND gate N2 and NAND gate N6; a NAND gate N6 for NANDing the output signal of the NAND gate N4 and the output signal of the NAND gate N5; an inverter I1 for inverting the clock signal CLKin; a pulse signal generator 10a for generating a pulse signal in accordance with the output signal of the inverter I1; a NAND gate N7 for NANDing the output signal of the pulse signal generator 10a and the output signal of the NAND gate N6; and an inverter I2 for inverting the output signal of the NAND gate N7 and for outputting the output signal OUT.

The output terminal of the NAND gate N2 is connected to an input terminal of the NAND gate N1. The output terminal of the NAND gate N4 is connected to an input terminal of the NAND gate N3. The NAND gate N5 NANDs the respective output signals of the NAND gate N2 and the NAND gate N6.

The operation of the thusly constituted phase detector 10 will now be described with reference to the accompanying drawings.

The phase detector 10 compares the reference clock signal CLKfbk as shown in FIG. 3 and the clock signal CLKin as shown in FIG. 3. Thus when the reference clock signal CLKfbk starts faster than the clock signal CLKin, the output signal OUT becomes a low level. By contrast when the clock signal CLKin starts faster than the reference clock signal CLKfbk, the output signal OUT becomes a high level.

With reference to FIGS. 2 and 3A–3C, when the reference clock signal CLKfbk obtains a high level while the clock signal CLKin retains in a low level, a high level signal occurs at the node ND1 and a low level signal occurs at the node ND2. The NAND gate N7 outputs a high level signal and the inverter I2 outputs a low level signal serving as the output signal OUT, whereby the clock signal CLKin is regarded as starting slower than the reference clock signal CLKfbk. On the other hand, when the reference clock signal CLKfbk has a low level and the clock signal CLKin has a high level, the node ND1 comes to have a low level signal and the node ND2 comes to have a high level signal, as shown in FIG. 2. At this time, the pulse signal generator 10a which received a high level signal via the inverter I1, applies a high level signal to the NAND gate N7. Therefore, the NAND gate N7 outputs a low level signal, and the inverter I2 outputs a high level signal serving as the output signal OUT, whereby the clock signal CLKin comes to start faster than the reference clock signal CLKfbk.

However, because the conventional clock phase comparator simply compares each start time of the clock signal CLKin and the reference clock signal CLKfbk, when the clock signal CLKin and the reference clock signal CLKfbk are locked, the phase control system is alternately carried out in a faster mode or a slower mode. Therefore, the phase control system requires an otherwise unnecessary electric power, for further increasing power consumption even in a stand-by state.

SUMMARY OF THE INVENTION

Accordingly, it is an object of the present invention to provide a clock signal phase comparator capable of decreasing power consumption of a phase control system by partially or entirely disabling the phase control system when a phase-locked clock signal is detected.

To achieve the above-described object, there is provided a clock signal phase comparator according to the present invention which includes a first delay unit for delaying a clock signal for a predetermined time, a first phase detector for comparing an output signal of the first delay unit and a reference clock signal and outputting a first high or low level output signal, a second delay unit for delaying for a predetermined time and outputting the reference clock signal, and a second phase detector for comparing an output signal of the second delay unit and the clock signal and outputting a second high or low level output signal.

BRIEF DESCRIPTION OF THE DRAWINGS

FIG. 1 is a block diagram of a phase detector provided in a conventional clock signal phase comparator;

FIG. 2 is a circuit view detailing the phase detector in FIG. 1;

FIG. 3A is a timing diagram of a clock signal applied to the clock detector in FIG. 2;

FIG. 3B is a timing diagram of a reference clock signal applied to the clock detector in FIG. 2;

FIG. 3C is a timing diagram of an output signal in FIG. 2;

FIG. 6 is a timing diagram of a clock signal applied to the clock signal phase comparator in FIG. 4 and a reference clock signal applied to the clock signal phase comparator in FIG. 4;

FIG. 7 is a table illustrating resultant data obtained by a phase comparison in accordance with an output signal in the clock signal phase comparator in FIG. 4; and FIG. 8 is a block diagram of a clock signal phase comparator according to a second embodiment of the present invention.

DETAILED DESCRIPTION OF THE INVENTION

With reference to the accompanying drawings, the clock signal phase comparator according to the preferred embodiments of the present invention will now be described.

Figure 4:
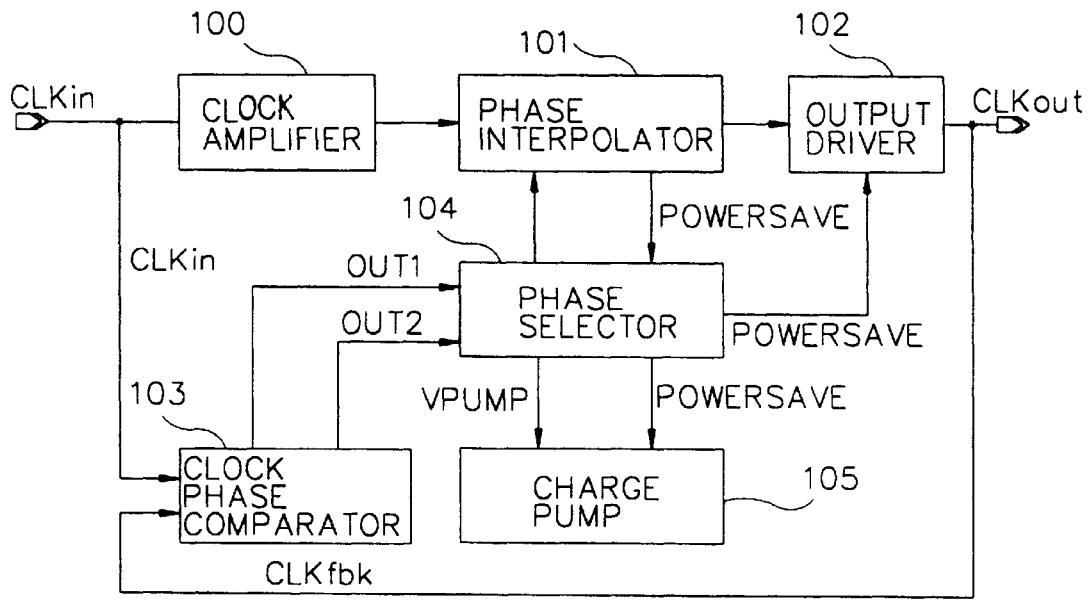
FIG. 4 is a block diagram of a phase detector according to a first embodiment of the present invention.

As shown in FIG. 4 which illustrates a phase control system applicable to the present invention, the system includes a clock amplifier 100, a phase interpolator 101, an output driver 102, a clock phase comparator 103, a phase selector 104, and a charge pump 105.

Figure 5:
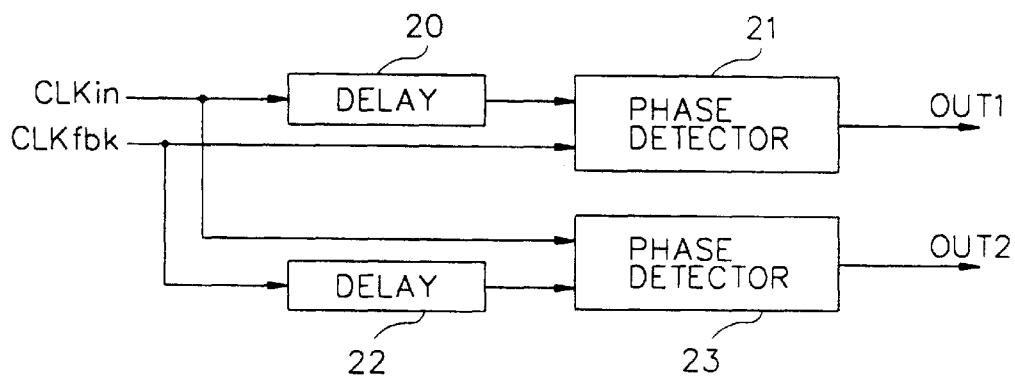
FIG. 5 is a detailed block diagram of a delay unit in FIG. 4.

Referring to FIG. 5, the clock phase comparator 103 includes: a delay unit 20 for delaying a clock signal CLKin for a predetermined time t1; a phase detector 21 for comparing an output signal of the delay unit 20 with a reference clock signal CLKfbk and outputting a low level output signal OUT1; another delay unit 22 for delaying the reference clock signal CLKfbk for a predetermined time t2; and a phase detector 23 for comparing an output signal of the delay unit 22 with the clock signal CLKin and outputting a high or low level output signal OUT2.

The delay unit pair 20, 22 are respectively provided with an even number of sequentially connected inverters. Here, the predetermined time t1, which is the delay provided in accordance with the delay unit 20, denotes a marginal allowance of a clock jitter, and the predetermined time t2 which is the delay provided in accordance with the delay unit 22 denotes a marginal allowance toward a direction against the clock jitter.

The operation of the thusly constituted clock phase comparator according to the present invention will now be described with reference to the accompanying drawings.

With reference to FIG. 6, a first case ① illustrates that the clock signal CLKin is slower than the reference clock signal CLKfbk. At this time, the phase detector 23 compares the clock signal CLKin with the reference clock signal CLKfbk delayed for time t2 in accordance with the delay unit 22. Therefore, when the clock signal CLKin is slower than the output signal of the delay unit 22, the phase detector 23 generates a low level output signal OUT2. At this time, because the phase detector 21 receives the clock signal CLKin and the reference clock signal CLKfbk delayed for time t1 in accordance with the delay unit 20, the phase detector 21 generates a low level output signal OUT1.

A second case ② illustrates an example in which the reference clock signal CLKfbk and the clock signal CLKin are locked for time t1 and time t2, respectively. Here, because the clock signal CLKin is applied to the phase detector 21 via the delay unit 20, the reference clock signal CLKfbk becomes relatively faster, whereby the phase detector 21 generates a low level output signal OUT1. Also, the reference clock signal CLKfbk is applied to the phase detector 23 via the delay unit 22, so that the clock signal CLKin becomes relatively faster, whereby the phase detector 23 generates a high level output signal OUT2.

A third case ③ exhibits that the clock signal CLKin is faster than the reference clock signal CLKfbk. Here, when the clock signal CLKin is faster than the reference clock signal CLKfbk by a delayed time t1 in the delay unit 20, the phase detector 21 generates a high level output signal OUT1 and at this time the phase detector 23 also generates a high level output signal OUT2.

When the clock signal CLKin and the reference clock signal CLKfbk have a difference of 180° in phase angle, the phase detector 21 generates a high level output signal OUT1, and the phase detector 23 generates a low level output signal OUT2. The comparison results the clock signals are illustrated in FIG. 7.

As a result, when the output signals OUT1, OUT2 are respectively "1", "1", the phase selector 104 in the phase control system outputs a control signal Vpump for thereby delaying the clock signal CLKin. By contrast when the output signals OUT1, OUT2 are respectively "0", "0", the phase selector 104 in the phase control system carries out an operation of moving up the clock signal CLKin with regard to time.

When the output signals OUT1, OUT2 of the clock phase comparator 103 are respectively "0", "1", that is to say, when the reference clock signal CLKfbk and the clock signal CLKin are locked with each other, the phase selector 104 outputs a power save signal POWER-SAVE to respective blocks, for thereby disabling the system partially or entirely and saving electric power in the system.

Also, when the output signals OUT1, OUT2 are respectively "1", "0", the clock signal CLKin and the reference clock signal CLKfbk have a difference of 180° in phase angle, and at this time the phase control system maintains a previous state.

With reference to FIG. 8 illustrating a clock signal phase comparator according to the second embodiment of the present invention, the comparator includes: a delay unit 30 for delaying a clock signal CLKin for a predetermined time; a phase detector 31 for comparing an output signal of the delay unit 30 with a clock signal CLKin and outputting a high or low level output signal OUT1; another delay unit 32 for delaying and outputting the reference clock signal CLKfbk for a predetermined time; and a phase detector 33 for comparing an output signal of the delay unit 32 with the clock signal CLKin and outputting a high or low level output signal OUT2.

At this time, the time delayed by the delay unit 30 is equivalent to a marginal allowance in accordance with a cycle of the reference clock signal CLKfbk and a clock jitter thereof, so that the time delayed in the delay unit 32 corresponds to the time t2 delayed by the delay unit 22 in FIG. 5.

The clock signal phase comparator as shown in FIG. 8 is appropriate to a case in which a reference clock signal CLKfbk has a level different from a clock signal CLKin as in a CMOS level and a TTL level. That is, in the case in which the reference clock signal CLKfbk and the clock signal CLKin has a level different from each other, it is difficult to delay the clock signal CLKin, so that effects similar to the clock phase comparator as shown in FIG. 5 may be obtained in accordance with delaying the reference clock signal CLKfbk using the delay unit pair 30, 32.

As described above, the clock signal phase comparator separately displays the phase comparison results in grades of fast, slow and locking, and when a locked phase is detected, the phase control system is partially or entirely disabled, for thereby reducing current consumption of the system.

What is claimed is:

1. A clock signal phase comparator, comprising:
   a first phase detector for comparing a clock signal and a first reference clock signal and for outputting a first high or low level output signal;
   a second phase detector for comparing the clock signal and a second reference clock signal and for outputting a second high or low level output signal; and
   first and second delay units, the first delay unit delaying a reference clock signal by a first delay to generate the first reference clock signal, the second delay unit delaying the reference clock signal by a second delay to generate the second reference clock signal, the first and second delays being different.

2. The phase comparator of claim 1, wherein each of the first and second delay units comprises an even number of inverters sequentially connected with each other.

3. The phase comparator of claim 1, wherein the first delay corresponds to a marginal allowance time with regard to a clock jitter, and the second delay corresponds to a marginal allowance time with regard to a direction against the clock jitter.

* * * * *